United States Patent [19]
Lin

[11] Patent Number: 5,222,014
[45] Date of Patent: Jun. 22, 1993

[54] THREE-DIMENSIONAL MULTI-CHIP PAD ARRAY CARRIER

[75] Inventor: Paul T. Lin, Austin, Tex.

[73] Assignee: Motorola, Inc., Schaumburg, Ill.

[21] Appl. No.: 844,075

[22] Filed: Mar. 2, 1992

[51] Int. Cl.[5] .............................................. H05K 1/14
[52] U.S. Cl. .................................... 361/414; 29/840;
29/739; 228/180.2; 228/387; 361/393; 361/396;
361/406; 361/412; 257/723; 257/701; 257/712
[58] Field of Search ................ 29/830, 840, 739;
174/260, 261; 222/180.2; 357/75, 80, 81;
361/387-389, 386, 393, 396, 400, 403, 406, 412,
413; 439/44, 66, 69

[56] References Cited

U.S. PATENT DOCUMENTS

| | | | |
|---|---|---|---|
| 4,672,421 | 6/1987 | Lin | 357/80 |
| 4,878,611 | 11/1989 | LoVasco et al. | 228/180.2 |
| 5,011,066 | 4/1991 | Thompson | 228/180.2 |
| 5,036,431 | 7/1991 | Adachi et al. | 361/396 |
| 5,060,844 | 10/1991 | Behun et al. | 228/180.2 |

FOREIGN PATENT DOCUMENTS

| | | | |
|---|---|---|---|
| 0092230 | 6/1983 | Japan | 357/75 |
| 0238148 | 9/1989 | Japan | 357/80 |

OTHER PUBLICATIONS

Goldmann et al, "Balance Straining Package", IBM Tech. Disclosure Bulletin, vol. 14, No. 9, Feb. 1972, pp. 2595-2596.

"GaAs Multichip Module for a Parallel Processing System," by Takeshi Miyagi et al., 40th Electronic Components & Technology Conference, May 20-23, 1990, pp. 580-585.

"Stacked High-Density Multichip Module," by R. A. Jarvela et al., IBM Technical Disclosure Bulletin, vol. 14, No. 10, Mar. 1972, pp. 2896-2897.

"3-D Interconnection for Ultra-Dense Multichip Modules," by Christian Val et al., IEEE Transactions on Components, Hybrids, and Manuf. Tech., vol. 13, No. 4, Dec. 1990, pp. 814-821.

"DIP Storage Module with Stacked Chips," by J. W. Schmieg, IBM Technical Disclosure Bulletin, vol. 23, No. 6, Nov. 1980, p. 2337.

*Primary Examiner*—Gregory D. Thompson
*Attorney, Agent, or Firm*—James L. Clingan, Jr.

[57] ABSTRACT

A stackable three-dimensional multi-chip module (MCM) is provided whereby each level of chip carrier is interconnected to another level of chip carrier through reflowing of solder balls pre-bumped onto each carrier. Each level of chip carrier, except for the top carrier, has solder balls on both top and bottom surfaces of the substrate. Optional lids can be used to seal each device, and the lid height would serve as a natural positive stand-off between each level of carriers, giving rise to hour glass shaped solder joints which maximizes the fatigue life of the joints. Heat sinks to further enhance heat dissipation of the MCM can be easily accommodated in this stacking approach. Furthermore, each substrate is capable of carrying multiple chips, so the module incorporates planar chip density growth concurrently with the three-dimensional growth giving rise to an ultradense MCM.

17 Claims, 2 Drawing Sheets

THREE-DIMENSIONAL MULTI-CHIP PAD ARRAY CARRIER

FIELD OF THE INVENTION

The present invention relates to semiconductor devices in general, and more specifically to stackable three dimensional multiple chip modules and pad array carriers.

BACKGROUND OF THE INVENTION

Most large scale integrated circuits (ICs) are presently packaged in plastic or ceramic packages with metal leads extended therefrom for soldering to a printed circuit (PC) board or for insertion into a socket. Typically, these IC packages are configured as dual-in-line or quad-flat packages. In most instances only a single IC is contained within a package, although multiple chips are sometimes contained within a package. The circuit density resulting from this packaging technology is not very great since the ceramic or plastic package consumes relatively large areas of the mounting surface, usually a printed circuit board, particularly if a socket is used.

Moreover, printed circuit boards, like everything else in electronics, are getting smaller, faster and denser. A more compact packaging technology is needed when mounting area is limited or when speed considerations dictate that circuit elements be closely spaced. One such technology comprises the use of a cofired ceramic substrate onto which ICs in an unpackaged form are directly attached to the ceramic mounting surface and are wire bonded to conductive areas on the mounting surface, or are inverted and connected directly to metallized areas on the ceramic mounting surface by, for example, a solder-bump technique. This multiple chip module (MCM) technology has several limitations, however. Interconnecting multiple ICs on a single ceramic mounting surface requires deposition of a metallic material in a pattern which desirably avoids crossovers. Furthermore, the deposition of metallic conductors of extremely fine resolution is difficult on many surfaces. Multi-layered interconnections are also possible but are sometimes prohibitively expensive and have limited thermal power dissipation capability under air cooling. Direct chip attach has a further limitation of no burn-in capability before module assembly and is difficult to repair after board mounting. Additionally, if components, whether active or passive, are necessary to the circuit, discrete components must be used with their attendant problems of size and mounting mechanisms.

Nevertheless, the advent of MCMs offers distinct advantages in the packaging of ICs. Time delay between chips is less; electrical noise and cross talk are less; and size is less. The chips used can be bigger, and the I/O lead counts have greatly increased per multiple chip module. Despite their various advantages, however, current MCMs have their own set of problems. Thermal management problems have become huge. Heat generated from multiple devices must be removed. As gates are crowded ever more densely on a chip, the entire thermal path, from die to die-attach to substrate to heat sink, should be taken into account. Single crystal silicon and high thermal conductivity ceramics such as aluminum nitride and silicon carbide have heat transfer and thermal averaging capabilities better than traditional ceramic and printed-circuit board materials. Temperature gradations also strongly influence the reliability of solder, wire bond, and electrical connection. In effect, to achieve a successful MCM design, a balance must be struck between materials having individually the most effective thermal conductivity and materials having as a group similar coefficients of thermal expansion.

Traditionally, all dice are probed individually before assembly, while critical units are burned in under accelerated aging conditions to minimize the risk of subsequent system failure. Burn-in is performed to screen out weak devices, and packaged devices rather than bare chips are normally burned-in. Most burn-in failures are device or die related due to weak gate oxide. Adapting burn-in to MCMs, this process should be performed at the packaged module level. The drawback in module level burn-in is that a percentage with die in the module will fail, and replacement of another good die has to be performed by proper removing procedure.

Another MCM approach interconnects bare chips not in the X-Y plane but along the Z-axis. Three dimensional packaging offers higher memory density and less required interconnect density than planar multiple chip substrates. Consequently, connection systems that link MCMs, discretes, and passives are expected to grow in the Z-direction, orthogonal to the substrate. Three-dimensional packaging of ICs offers advantages in numerous fields. For example, it can be useful in supercomputer memories where speed and densification are important, or in large cache memories where access time and densification are critical.

One method of interconnecting bare chips forms a cube of stacked chips. Chips are individually interconnected on a thin film identical to a TAB film by means of gold wires prior to cubing. After passing electrical testing and burn-in, they are then glued on top of one another with TAB film. A major disadvantage to this configuration is limited heat dissipation. Furthermore, once this cube of chips is formed and mounted onto a substrate, rework of subsequent chip failure is highly impractical, so redundant chips are included in the stack which adds to the overall cost of the module.

An ultradense MCM would ideally incorporate the planar multi-chip module with the three-dimensional approach. Stacking of Pin Grid Arrays (PGAs) to form an MCM has been in existence for two decades. A bottom substrate is provided with copper pins in a conventional manner. Semiconductor dice are then flip-chip mounted to chip carrier substrates. An interposer physically and electrically couples a chip carrier substrate to another chip carrier or to the bottom substrate by way of solder joining the interconnections. These interconnections are located around the periphery of each substrate which could feasibly limit chip configuration and, therefore, chip density on each level. The copper pins of the PGAs and the interposers provide the stand-off between the carriers to keep them from collapsing onto each other.

Thus, power distribution, heat dissipation, and temperature, as well as testing, burn-in, and rework should all be taken into consideration in the successful design of MCMs. The difficulty in designing MCMs is finding and assembling materials with the right blend of electrical, mechanical, and thermal properties. Trade-offs are almost always required and typically depend on the application. A need exists for an easily manufacturable ultradense MCM which is cost effective as well as meeting all of the design criteria aforementioned.

SUMMARY OF THE INVENTION

In accordance with the invention, there is provided a stacking semiconductor multiple chip module having a lower chip carrier substrate, an upper chip carrier substrate, and semiconductor dice. The lower chip carrier is of a thermally conductive material and has a plurality of solder bumps on both top and bottom surfaces. The upper chip carrier substrate is also of a thermally conductive material and has a plurality of solder bumps on its bottom surface. The semiconductor dice are attached, at least one per substrate, electrically and physically to the lower and upper chip carrier substrates. The semiconductor die attached to the lower chip carrier substrate has an encapsulant which encapsulates the semiconductor die to protect it and to serve as a stand-off. The lower chip carrier substrate and upper chip carrier substrate are electrically and physically interconnected by a joining of the solder bumps. These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
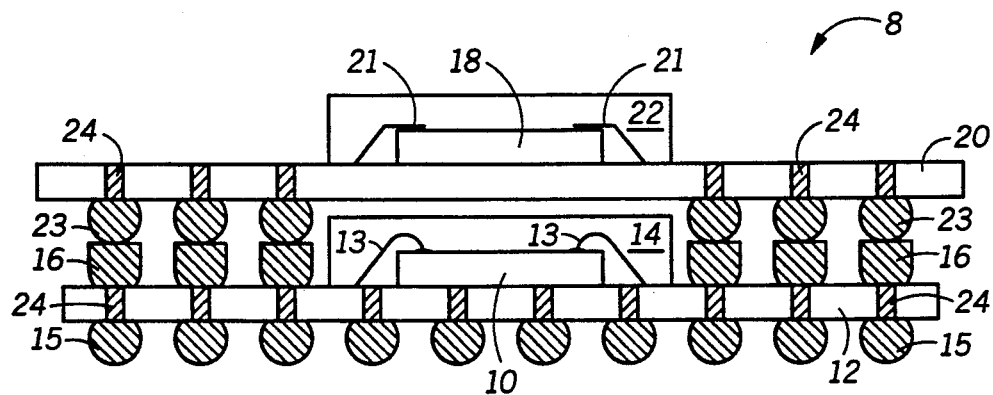
FIG. 1 is a cross-sectional view of a stacked three-dimensional semiconductor multiple chip module (MCM) prior to solder reflow, in accordance with the present invention.

With the present invention, it is possible to meet the previously stated desired feature of a three-dimensional multiple chip module to densely package semiconductor devices without sacrificing board space in the X-Y plane. The invention enables a multiple chip module to be stacked in the Z-direction. Moreover, this invention provides a method for manufacturing such a module. In accordance with the invention a cross-sectional view of a stacking multiple chip module 8, prior to solder reflowing, is illustrated in FIG. 1. A semiconductor die 10 is mounted onto a lower chip carrier substrate 12. Electrical connections between semiconductor die 10 and lower chip carrier substrate 12 are made by wires 13 bonded in conventional fashion. Furthermore, semiconductor die 10 is encapsulated by an encapsulant 14, which can be of any conventional encapsulating material, such as a molding compound or glob top, or any other suitable material. Encapsulant 14 encapsulates the semiconductor die 10 to protect the die 10 and also the wires 13. Lower chip carrier substrate 12 is preferably formed from a thermally conductive material such as aluminum nitride or silicon. Printed circuit board material such as FR-4 can also be used although this material is not as thermally conductive as a ceramic or silicon. A large thermal expansion mismatch must also be considered when choosing PC board material. Its low cost, however, may be enough of an incentive to the user to accept.

Additionally shown in FIG. 1, the lower chip carrier substrate 12 has a plurality of solder bumps 15 on the bottom surface of the substrate. These solder bumps 15 are used to mount the lower chip carrier substrate 12 to the actual PC board, which is not shown. Furthermore, lower chip carrier substrate 12 also has a plurality of solder bumps 16 on the top surface of the substrate. Solder bumps 16 serve to join lower chip carrier substrate 12 to another chip carrier to be mounted above.

Also shown in FIG. 1 is another semiconductor die 18 mounted onto an upper chip carrier substrate 20. Electrical connections between semiconductor die 18 and upper chip carrier substrate 20 is made by wires 21 TAB bonded to the substrate. Furthermore, semiconductor die 18 is encapsulated by an encapsulant 22, which can be of any conventional encapsulating material, such as a molding compound or glob top, or any other suitable material. Upper chip carrier substrate 20 also has a plurality of solder bumps 23 on its bottom surface. When the lower chip carrier substrate 12 and upper chip carrier substrate 20 are properly aligned for solder joining, then the solder bumps 16 and 23 combine to form fine pitch solder columns. Encapsulant 14 around the semiconductor die 10 serves as a stand-off during the solder reflowing of solder bumps 16 and 23 to prevent the collapse of the solder joint.

In this embodiment, lower chip carrier substrate 12 and upper chip carrier substrate 20 have through-hole vias 24 to make electrical connections to each other and to other substrates. However, multi-layer chip carrier substrates could also be used for the same purpose of making electrical connections to another substrate.

Figure 2:
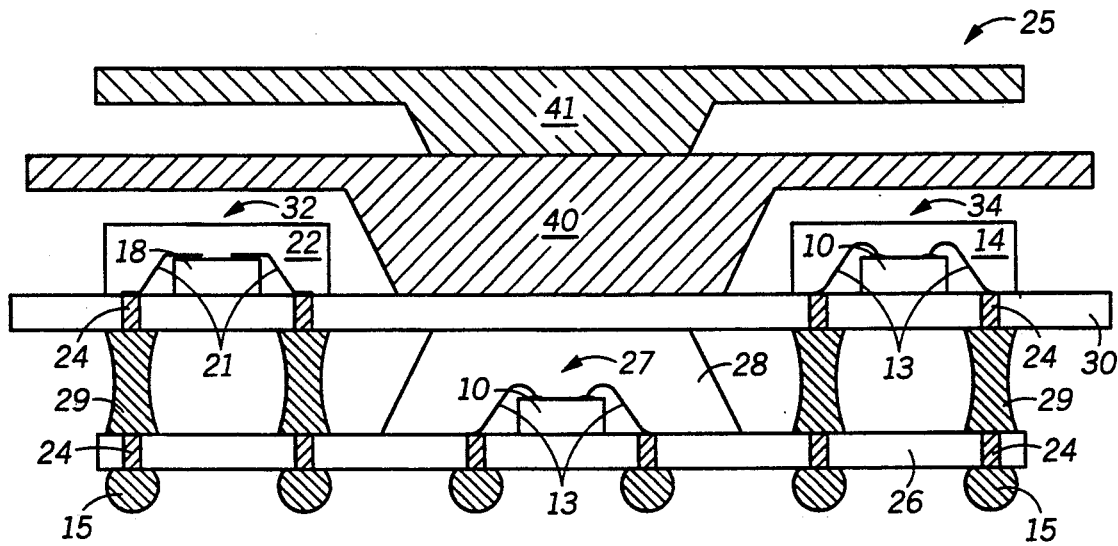
FIG. 2 is a cross-sectional view of a stacked three-dimensional semiconductor MCM with a heat sink, illustrating an embodiment of the present invention.

Illustrated in FIG. 2 is a cross-sectional view of a stacking multiple chip module 25. Many of the features in this embodiment are the same as previously discussed in FIG. 1, and will, thus, be labelled accordingly. In this embodiment, the lower chip carrier substrate 26 has one semiconductor device 27 mounted thereon. A thermally conductive lid 28 caps the semiconductor device 27. Lid 28 can serve as a positive stand-off to create hour glass shaped solder joints 29. This hour glass shape maximizes the time to failure of the solder joints 29 due to fatigue stresses. The sizes of the solder bumps 16 and 23, aforementioned in FIG. 1, need to be optimized according to lid height to achieve the hour glass shape of solder joints 29. Without a lid in place, the top and bottom solder bumps will coalesce during the solder reflow process to form larger single solder bumps. While this shape may be acceptable, the hour glass shape is more desirable for fatigue life. Upper chip carrier substrate 30 has two semiconductor devices 32 and 34 mounted thereon in a staggered configuration. A heat sink 40 is attached to the upper chip carrier substrate 30 where it can dissipate heat from the lower semiconductor device 27 through the thermally conductive upper chip carrier substrate 30 and lid 28. It should be noted that if a third level chip carrier is used, then the subsequent upper level semiconductor devices must also be staggered to allow a heat sink to be attached to dissipate heat away from the lower level semiconductor devices. A second heat sink 41 is mounted above heat sink 40 to form a stacked cooling fin configuration. It is entirely possible to add more heat sinks above heat sink 41 to increase the level of heat dissipation of the MCM, with the only limitation being the volume available above the PC board whereon the MCM is to be mounted.

Figure 3:
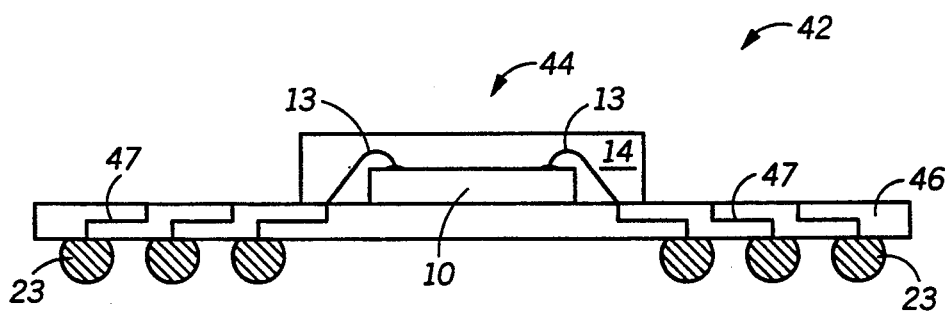
FIG. 3 is a cross-sectional view of a semiconductor device mounted onto a chip carrier substrate with solder bumps on the lower surface of the substrate, which illustrates a step in assembling the three-dimensional semiconductor MCM, in accordance with the present invention.

Also in accordance with the present invention is a method for stacking chip carriers to create a three-dimensional MCM. Illustrated in FIG. 3 is a cross-sectional view of a partially populated chip carrier 42. As illustrated in FIG. 3, a semiconductor device 44 is mounted onto a chip carrier substrate 46. Chip carrier substrate 46 is illustrated to be multilayered. It should be noted that a chip carrier substrate in any of the embodiments can be multilayered or have through-hole vias to enable electrical connections of the device to a board. A plurality of solder bumps or balls 23 of a particular solder composition are then deposited onto the bottom surface of chip carrier substrate 46. This solder, for example, may be of an 80/20 Pb/Sn composition or any other workable solder alloy composition. Electrical connections are made between the semiconductor device 44 and solder bumps 23 via multi-layer interconnects 47. Chip carrier 42 can be tested and burned-in either before or after the deposition of solder bumps 23.

Figure 4:
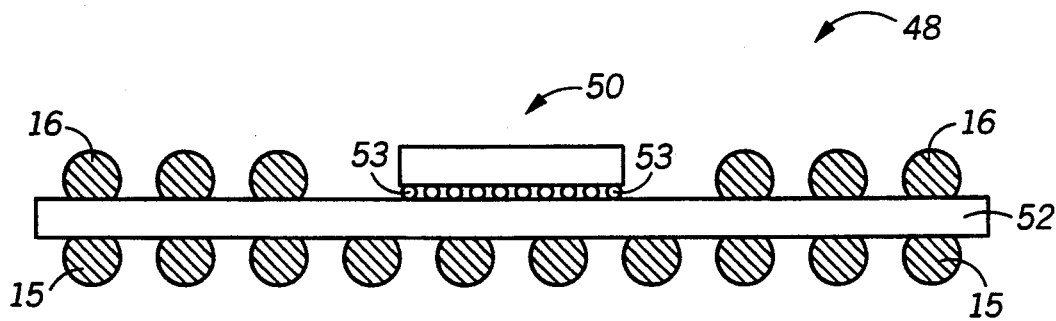
FIG. 4 is a cross-sectional view of a semiconductor device mounted onto a chip carrier substrate with solder bumps on both the lower and upper surfaces of the substrate, which illustrates a step in assembling the three-dimensional semiconductor MCM, in accordance with the present invention.

A cross-sectional view of a fully populated chip carrier 48 is illustrated in FIG. 4. A semiconductor device 50 is mounted on a chip carrier substrate 52. As illustrated in FIG. 4, semiconductor device 50 is shown as a Pad Array Carrier (PAC) mounted onto substrate 52 with C4 technology solder bumps 53, but any other viable method of mounting can also be used. A plurality of solder bumps or balls 16, preferably of a different composition than solder bumps 23, are deposited onto the top surface of chip carrier substrate 52. The composition of solder bumps 16 can be of 60/40 Pb/Sn alloy or of another ratio. The reason for using solder of different alloy compositions on each chip carrier substrate is to facilitate rework and to prevent remelting of the solder joints in subsequent solder reflow operations. An example of a possible subsequent reflow step is the stacking of a third carrier onto the multiple chip module. Rework is also made easier because a focused beam is used to remove a solder joint. Therefore, it is desirable not to disturb the other interface of solder and substrate during the remelting of solder. In addition to solder bumps 16, which are on the top of chip carrier substrate 52, a plurality of solder bumps 15 are also deposited on the bottom surface of substrate 52. These solder bumps 16 will be used to mount the complete MCM onto a PC board, which is not shown. Again, these solder bumps should preferably be of a different composition than either solder bumps 23 or solder bumps 16, for the aforementioned reasons.

Figure 5:
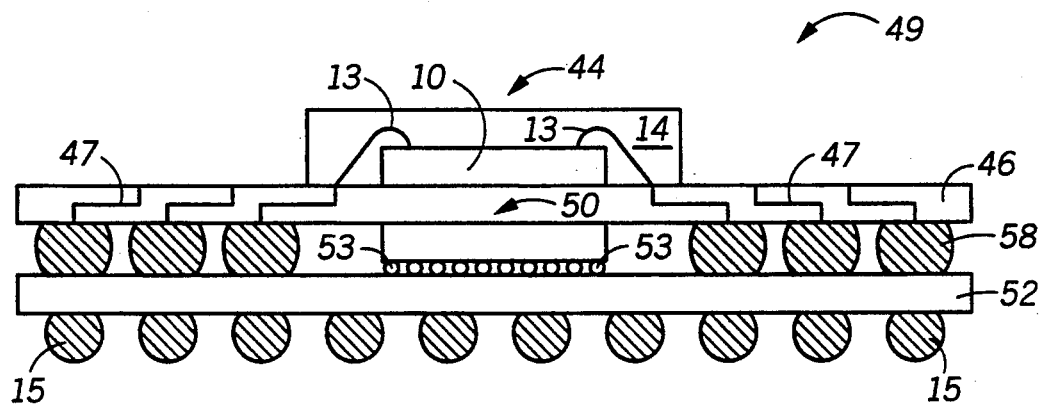
FIG. 5 is a cross-sectional view of a stacked three-dimensional semiconductor MCM, illustrating an embodiment of the present invention.

Each of the chip carriers, 42 and 48, may be tested and burned-in separately before assembling the stacked MCM. An embodiment of the invention, a stacked three-dimensional MCM 49, is illustrated in FIG. 5. In the stacking process, the two chip carrier substrates 46 and 52 and particularly the arrays of solder bumps 16 and 23, should be aligned properly with respect to each other before solder reflow. An example of the proper alignment is shown in FIG. 1. In the solder reflow process, solder bumps 16 and 23 will coalesce to form single solder joint columns 58, as illustrated in FIG. 5. This configuration should be more reliable than solder joining two copper pins together because the top and bottom solder bumps will fuse together to form single interconnections without a weak point at the joint as in the case of the copper pins.

Figure 6:
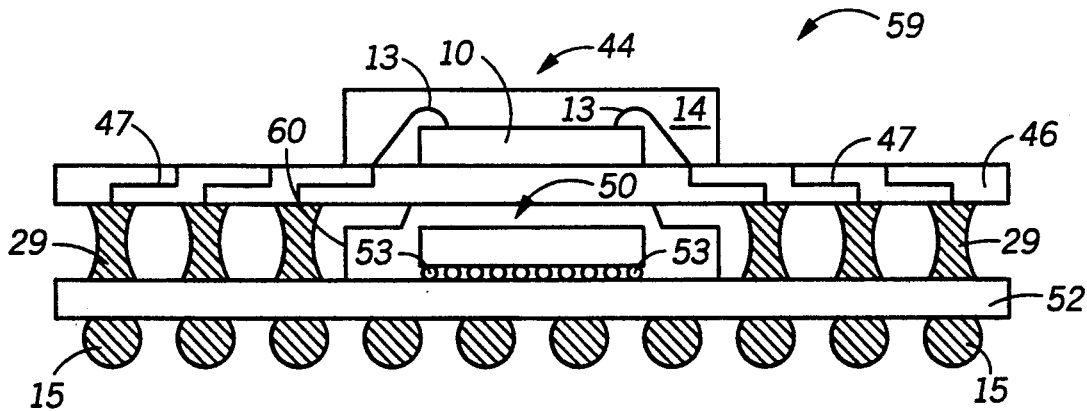
FIG. 6 is a cross-sectional view of a stacked three-dimensional semiconductor multiple chip module with a lid over the lower semiconductor device, illustrating an embodiment of the present invention.

A variation of the present invention is illustrated in FIG. 6. Shown is a cross-sectional view of a stacked MCM 59. A thermally conductive lid 60 has been added to the stacking configuration to form a stand-off for solder joints 29. Because of the physical restraint imposed by lid 60, solder joints 29 take on an hour glass shape which increases fatigue life for the joints because concentrated stress at the edges of the joints has been reduced.

A major advantage to the process of creating a stacked MCM is that each level of chip carriers can be assembled, tested, and burned-in prior to assembling the module. Therefore, costly rejects or using redundant chip sets can be avoided. Furthermore, rework of the present invention can be performed easily. Each solder joint or solder column can be removed and rejoined by a localized hot air technique.

The foregoing description and illustrations contained herein demonstrate many of the advantages associated with the present invention. Furthermore, it has been revealed that the configuration of this three-dimensional MCM is an efficient heat dissipating unit. The array of solder columns serve as cooling fins to aide in the natural heat convection away from the module. Thus it is apparent that there has been provided, in accordance with the invention, a stackable three dimensional multiple chip module that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, dummy solder bumps could also be used for mechanical support of the lower chip carrier without affecting any of the electrical characteristics of the stacked three-dimensional MCM or the space saving advantage in the X-Y plane of the stacking configuration. It is also important to note that the present invention is not limited in any way to only stacking pad array carriers. Any suitable method of mounting and electrically coupling packaged semiconductor devices to a chip carrier substrate that still allows stacking of the substrates may be utilized. Therefore, it is intended that this invention encompass all such variations and modifications as fall within the scope of the appended claims.

I claim:

1. A stacking semiconductor multiple chip module comprising:
   a lower chip carrier substrate of thermally conductive material having a plurality of solder bumps on both top and bottom surfaces of the lower chip carrier substrate;
   a first semiconductor die electrically and physically attached to the lower chip carrier substrate;

an encapsulant which encapsulates the first semiconductor die to protect the first semiconductor die;

an upper chip carrier substrate of thermally conductive material having a top and a bottom surface;

a plurality of solder bumps on the bottom surface of the upper chip carrier substrate; and a second semiconductor die mounted and electrically coupled to the upper chip carrier substrate, wherein the lower chip carrier substrate and the upper chip carrier substrate are electrically connected to each other by a joining of the solder bumps; and wherein the encapsulant serves as a stand-off between the lower chip carrier substrate and the upper chip carrier substrate.

2. The semiconductor multiple chip module according to claim 1 wherein the lower chip carrier substrate and upper chip carrier substrate are comprised of a material selected from the group consisting of: aluminum nitride ceramic, cofired ceramic, silicon wafer material, and epoxy glass cloth composite.

3. The semiconductor multiple chip module according to claim 1 wherein the lower chip carrier substrate further comprises dummy solder bumps for mechanical support.

4. The semiconductor multiple chip module according to claim 1 wherein the solder bumps on the top and bottom surfaces of the lower chip carrier substrate and the solder bumps on the bottom of the upper chip carrier substrate contain different solder compositions.

5. The semiconductor multiple chip module according to claim 1 wherein the lower chip carrier substrate and upper chip carrier substrate have through-hole vias.

6. The semiconductor multiple chip module according to claim 1 wherein the lower chip carrier substrate and upper chip carrier substrate are multi-layered.

7. A stacking semiconductor multiple chip module comprising:

a lower chip carrier of thermally conductive material having a plurality of solder bumps on both top and bottom surfaces of the carrier;

a first semiconductor die electrically and physically attached to the lower chip carrier;

an upper chip carrier substrate of thermally conductive material having a top and a bottom surface;

a plurality of solder bumps on the bottom surface of the upper chip carrier substrate;

a second semiconductor die mounted and electrically coupled to the upper chip carrier substrate, wherein the lower chip carrier substrate and the upper chip carrier substrate are electrically connected to each other by solder joints; and a lid capping the first semiconductor die and serving as a positive stand-off to create hour-glass solder joints between the upper chip carrier substrate and the lower chip carrier substrate.

8. The semiconductor multiple chip module according to claim 7 wherein the lower chip carrier substrate and upper chip carrier substrate are comprised of a material selected from the group consisting of: aluminum nitride, cofired ceramic, silicon wafer material, and epoxy glass cloth composite.

9. The semiconductor multiple chip module according to claim 7 wherein the lower chip carrier substrate further comprises dummy solder bumps for mechanical support.

10. The semiconductor multiple chip module according to claim 7 wherein the solder bumps on the top and bottom surfaces of the lower chip carrier substrate and the solder bumps on the bottom of the upper chip carrier substrate comprise different solder compositions.

11. The semiconductor multiple chip module according to claim 7 wherein the lower chip carrier substrate and upper chip carrier substrate have through-hole vias.

12. The semiconductor multiple chip module according to claim 7 wherein the lower chip carrier substrate and upper chip carrier substrate are multi-layered.

13. A method for making a stackable semiconductor multiple chip module comprising the steps of:

providing a lower chip carrier substrate of thermally conductive material;

depositing a plurality of solder bumps on both top and bottom surfaces of the lower chip carrier substrate;

mounting a first semiconductor die onto the lower chip carrier substrate and electrically coupling it to said lower chip carrier substrate;

placing a lid over the first semiconductor die to serve as a positive stand-off;

providing an upper chip carrier substrate of thermally conductive material, the upper chip carrier substrate having a top and a bottom surface;

depositing a plurality of solder bumps on the bottom surface of the upper chip carrier substrate;

mounting a second semiconductor die to the upper chip carrier substrate and electrically coupling it to the same;

aligning the upper chip carrier substrate to the lower chip carrier substrate by position of the solder bumps; and reflowing the solder bumps together to achieve physical and electrical connections.

14. The method of claim 13 wherein the steps of depositing solder bumps on the top and bottom surfaces of the lower chip carrier substrate and solder bumps on the bottom surface of the upper chip carrier substrate further comprises depositing solder of different compositions.

15. The method of claim 13 wherein the step of depositing solder bumps further comprises depositing dummy solder bumps on the lower chip carrier substrate for mechanical support.

16. The method of claim 13 wherein the step of providing the lower chip carrier substrate and the upper chip carrier substrate comprises providing a lower substrate and an upper substrate comprising of a material selected from the group consisting of: aluminum nitride, cofired ceramic, silicon wafer material, and epoxy glass cloth composite.

17. The method of claim 13 further comprising the step of:

attaching a heat sink to one of the surfaces.

* * * * *